(12) United States Patent
Whitton

(10) Patent No.: US 7,529,095 B2
(45) Date of Patent: May 5, 2009

(54) INTEGRATED ELECTRICAL SHIELD IN A HEAT SINK

(75) Inventor: David Whitton, Saline, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 0 days.

(21) Appl. No.: 11/863,874

(22) Filed: Sep. 28, 2007

(65) Prior Publication Data

US 2009/0086439 A1    Apr. 2, 2009

(51) Int. Cl.
 *H05K 7/20* (2006.01)
(52) U.S. Cl. ............... 361/719; 361/816; 174/530; 257/707
(58) Field of Classification Search ......... 361/719, 361/783, 816; 174/252–257; 257/686, 703–704, 257/713, 723; 438/121; 427/96.3, 123
See application file for complete search history.

(56) References Cited

U.S. PATENT DOCUMENTS

| | | | | |
|---|---|---|---|---|
| 5,025,114 A | * | 6/1991 | Braden | 174/530 |
| 5,043,534 A | * | 8/1991 | Mahulikar et al. | 174/359 |
| 5,098,864 A | * | 3/1992 | Mahulikar | 29/837 |
| 5,166,772 A | * | 11/1992 | Soldner et al. | 257/659 |
| 5,175,613 A | * | 12/1992 | Barker et al. | 257/713 |
| 5,200,809 A | * | 4/1993 | Kwon | 257/707 |
| 5,266,834 A | * | 11/1993 | Nishi et al. | 257/706 |
| 5,371,404 A | * | 12/1994 | Juskey et al. | 257/659 |
| 5,629,835 A | * | 5/1997 | Mahulikar et al. | 361/719 |
| 5,886,396 A | * | 3/1999 | Carney et al. | 257/666 |
| 5,952,719 A | * | 9/1999 | Robinson et al. | 257/737 |
| 6,278,182 B1 | * | 8/2001 | Liu et al. | 257/712 |
| 6,483,707 B1 | * | 11/2002 | Freuler et al. | 361/713 |
| 6,614,102 B1 | * | 9/2003 | Hoffman et al. | 257/666 |
| 7,035,113 B2 | * | 4/2006 | Fraley et al. | 361/783 |
| 7,161,810 B2 | * | 1/2007 | Fraley et al. | 361/719 |
| 7,183,132 B2 | * | 2/2007 | Nakamura | 438/106 |
| 7,262,369 B1 | * | 8/2007 | English | 174/370 |
| 2006/0002099 A1 | * | 1/2006 | Stoneham et al. | 361/816 |
| 2007/0071886 A1 | * | 3/2007 | Babb et al. | 427/96.3 |

* cited by examiner

*Primary Examiner*—Jayprakash N Gandhi
*Assistant Examiner*—Courtney L Smith
(74) *Attorney, Agent, or Firm*—Brinks Hofer Gilson & Lione

(57) ABSTRACT

A system having a heat exchanger with a bottom side, a first nonconductive layer coupled to the bottom side of the heat exchanger, a heat shield made of an electrically conductive material and being coupled to the first nonconductive layer, and an electrical connector electrically coupled to the heat shield, the electrical connector being capable of being connected to an electrical ground.

11 Claims, 2 Drawing Sheets

INTEGRATED ELECTRICAL SHIELD IN A HEAT SINK

BACKGROUND OF THE INVENTION

1. Field of the Invention

The invention relates to systems for providing heat dissipation and electrical shielding to integrated circuits.

2. Description of the Known Art

It is well known that integrated circuits emit significant amounts of heat. It is also known that these integrated circuits can only tolerate a certain amount of heat before failing to operate properly. This problem has become more pronounced as a number of transistors packaged within a given area of the integrated circuit continue to rise. To overcome this problem, numerous systems have been devised for removing heat from the integrated circuit. These systems include a variety of different heat exchangers, the most popular being a finned heat sink. More advanced cooling systems have combined finned heat sinks with electrical fans, liquid cooling systems and thermoelectric devices.

Another known problem is the amount of electromagnetic radiation emitted by the integrated circuit. The electromagnetic radiation emitted by one integrated circuit may affect the operation of other nearby integrated circuits. Although it is true that some integrated circuits emit relatively small amounts of electromagnetic radiation, other integrated circuits, such as class D amplifiers, emit significant amounts of electromagnetic radiation. One way of minimizing the effects of electromagnetic radiation is to place the integrated circuits responsible for emitting significant amounts of electromagnetic radiation at a safe distance from other electrical circuits, such that any radiation generated will have little to no effect. Other ways of minimizing the emission of electromagnetic radiation include the use of electrical shields. These shields, although effective, are relatively large compared to the size of the integrated circuit. This problem is exacerbated because many integrated circuits require the use of a heat sink, further increasing the area required to be shielded by the electrical shield.

D class amplifiers, such as those used in audio systems, are especially troublesome because they generate significant amounts of heat as well as significant amounts of electromagnetic radiation. D class amplifiers amplify an incoming audio signal and output the audio signal in an amplified form. By so doing, the amplified audio signal is capable of driving one or more audio speakers. Current home audio systems attach a heat sink to the D class amplifier. A large shield is also placed around the D class amplifier and the attached heat sink to minimize the emission of electromagnetic radiation. This solution, while acceptable in home audio systems, is difficult to implement in automobiles because of the relatively small area dedicated to audio electronics. Additionally, as automobile audio systems become more powerful, D class amplifiers emitting even more heat and more electromagnetic radiation must be implemented.

BRIEF SUMMARY OF THE INVENTION

In overcoming the drawbacks and other limitations of the related art, the present invention provides a system for providing heat dissipation and electrical shielding to integrated circuits. The system includes a heat exchanger with a bottom side, a first nonconductive layer coupled to the bottom side of the exchanger sink and a heat shield made of an electrically conductive material coupled to the first nonconductive layer. An electrical connector is electrically coupled to the heat shield and capable of being connected to an electrical ground thereby grounding the heat shield. The grounded heat shield shields other components from emitted electromagnetic radiation and the heat exchanger dissipates heat generated by the integrated circuit.

Further objects, features and advantages of this invention will become readily apparent to persons skilled in the art after a review of the following description, with reference to the drawings and claims that are appended to and form a part of this specification.

DETAILED DESCRIPTION OF THE INVENTION

Figure 1:
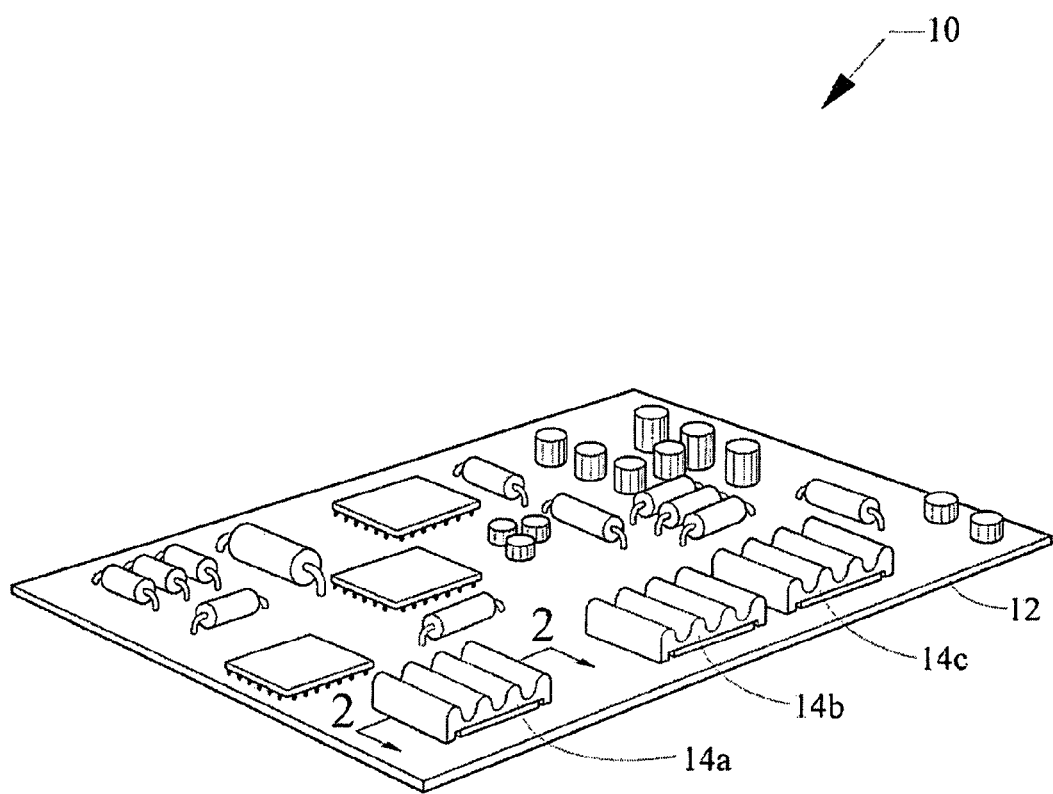
FIG. 1 is a perspective view of an audio electronic system having a system for providing heat dissipation and electrical shielding embodying the principles of the present invention.

Referring to FIG. 1, an audio electronic system 10 is shown. The audio electronic system 10 includes at least one circuit board 12 populated by a variety of electronic components. More specifically, the circuit board 12 is populated by a system for providing electrical shielding and heat dissipation 14a. Of course, it should be understood that more than one system for providing electrical shielding and heat dissipation may populate the circuit board 12, as shown by systems 14b, 14c. Although it was previously mentioned that the system 14a is utilized in the audio electronic system 10, it should also be understood that the system 14a may be used in a variety of different applications including, but not limited to, personal computer circuit boards and computer networking equipment, such as high speed routers.

Figure 2:
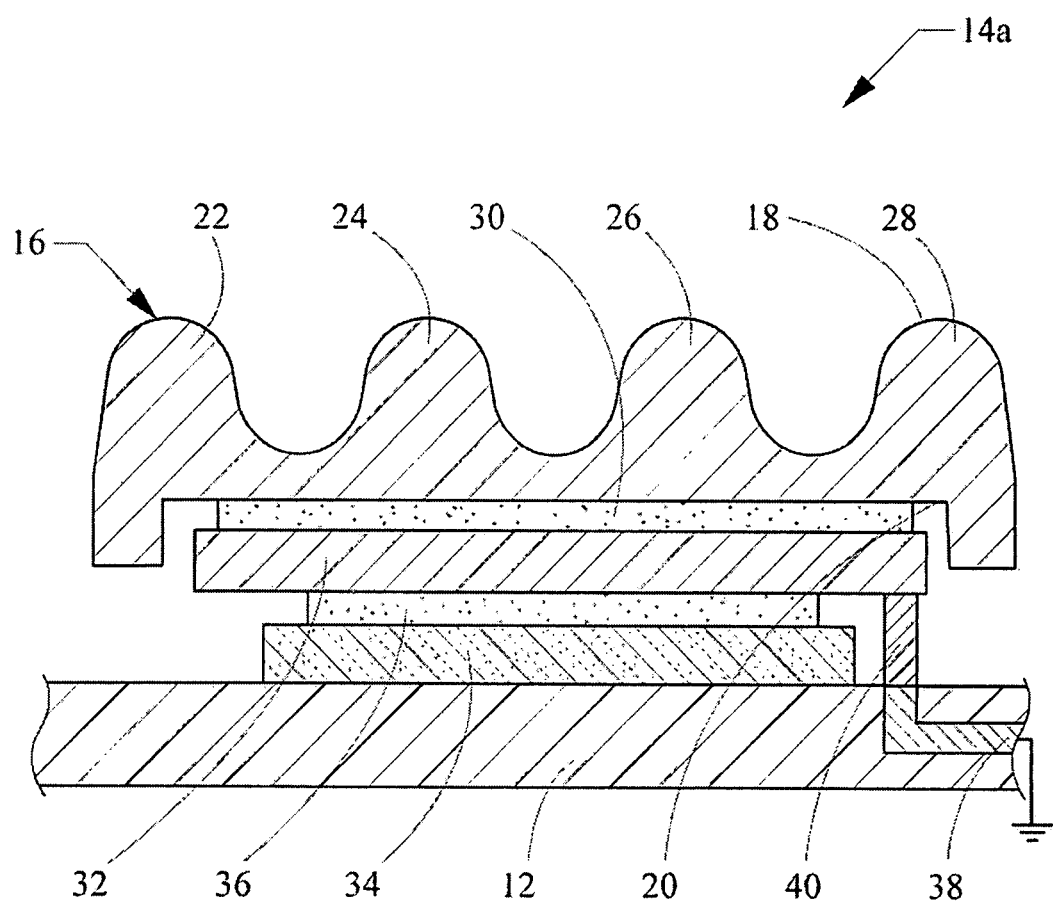
FIG. 2 is a partial cross sectional view generally taken along lines 2-2 in FIG. 1 of the system for providing heat dissipation and electrical shielding.

Referring to FIG. 2, a cross section of the system for providing electrical shielding and heat dissipation 14a, generally taking along lines 2-2 of FIG. 1, is shown. The system 14a includes a heat exchanger 16 having an exterior side 18 and an interior side 20. The heat exchanger 16 is generally a heat sink, wherein the exterior side 18 of the heat sink is formed to define a plurality of fins 22, 24, 26, 28. In order to maximize cooling, the heat exchanger 16 is generally made of a material that has a high thermal conductivity. Generally, the heat exchanger 16 is made of aluminum. Additional devices to aid the heat exchanger 16 may be coupled to the heat exchanger 16. These additional devices may include an electrical fan, a liquid cooling system and/or a thermoelectric cooling system.

Coupled to the interior side 20 of the heat exchanger 16 is a first electrically nonconductive layer 30. The first nonconductive layer 30 may be made out of any electrically nonconductive material, such as a nonconductive polymer. Coupled to the first nonconductive layer 30 is a heat shield 32. The heat shield 32 is made of an electrically conductive material and is electrically insulated from the heat exchanger 16 by the first nonconductive layer 30. The first non conductive layer 30 may be made of polyimide or epoxy with glass beads. The heat shield 32 is generally made of a conductive material including, but not limited to, copper, aluminum, sink, and combinations thereof.

Coupled to heat shield 32, opposite the first nonconductive layer 30, is an integrated circuit 34. The integrated circuit 34 is generally class D amplifier, but may also be any integrated circuit that outputs significant amounts of electrical noise, such as a power switching device. Optionally, a second nonconductive layer 36 may be located between the integrated circuit 34 and the heat shield 32, thereby electrically isolating the integrated circuit 34 from the heat shield 32. The second non conductive layer 36 may be made of polyimide or epoxy with glass beads. Heat generated by the integrated circuit 34 will travel to the heat exchanger 16 via the first and second nonconductive layers 30, 36 and the heat shield 32.

The integrated circuit 34 is populated on the surface the circuit board 12. The circuit board 12 includes at least one ground plane 38, which is connected to an electrical ground. The ground plane 38 is connected to the heat shield 32 by a conductive electrical connector 40. When the heat shield 32 is electrically coupled to the ground plane 38 via the electrical connector 40, the heat shield 32 acts as electrical shield, shielding other components from any electromagnetic radiation generated by the integrated circuit 34. It should also be understood that although the heat shield 32 is electrically isolated from the heat exchanger 16, the heat shield 32 in thermal communication with the heat exchanger 16 as well as the integrated circuit 34. By so doing, heat generated by the integrated circuit 34 travels through the heat shield 32 to the heat exchanger 16, so as to remove heat from the integrated circuit 34.

As a person skilled in the art will readily appreciate, the above description is meant as an illustration of implementation of the principles this invention. This description is not intended to limit the scope or application of this invention in that the invention is susceptible to modification, variation and change, without departing from the spirit of this invention, as defined in the following claims.

The invention claimed is:

1. A system for providing electrical shielding and heat dissipation, the system comprising:

a heat exchanger, the heat exchanger having an interior side and an exterior side;

a first electrically nonconductive layer coupled to the interior side of the heat exchanger;

a heat shield made of an electrically conductive material, the heat shield being coupled to the first electrically nonconductive layer, opposite the heat exchanger, the first electrically nonconductive layer electrically isolating the heat shield from the heat exchanger;

an electrical connector electrically coupled to the heat shield, the electrical connector being connected to an electrical ground;

an integrated circuit mounted on a circuit board, the integrated circuit having a top surface being in thermal contact with the heat shield;

wherein the circuit board has a surface that generally defines a first plane substantially parallel to a second plane generally defined by the top surface of the integrated circuit, the top surface having generally opposed side edges; and wherein the heat shield extends beyond the side edges of the top surface of the integrated circuit.

2. The system of claim 1, wherein the integrated circuit is a class D amplifier.

3. The system of claim 1, wherein the integrated circuit is a power switching device.

4. The system of claim 1, further comprising a second electrically nonconductive layer, the second electrically nonconductive layer being located between the integrated circuit and the heat shield.

5. The system of claim 4, wherein the second electrically nonconductive layer is made of a nonconductive polymer.

6. The system of claim 1, wherein the electrical connector electrically connects the heat shield to a ground plane of the circuit board.

7. The system of claim 1, further comprising a circuit board having a ground plane, the ground plane of the circuit board being electrically connected to the electrical connector.

8. The system of claim 1, wherein the heat shield is made of at least one of copper, aluminum, zinc and combinations thereof.

9. The system of claim 1, wherein the heat exchanger is a heat sink.

10. The system of claim 1, wherein the top side of the heat sink defines a plurality of fins.

11. The system of claim 1, wherein the first non conductive layer is made of a nonconductive polymer.

* * * * *